United States Patent [19]

Shekhawat et al.

[11] Patent Number: 4,970,635
[45] Date of Patent: Nov. 13, 1990

[54] INVERTER WITH PROPORTIONAL BASE DRIVE CONTROLLED BY A CURRENT TRANSFORMER

[75] Inventors: Sampat S. Shekhawat; John J. Dhyanchand, both of Rockford, Ill.

[73] Assignee: Sundstrand Corporation, Rockford, Ill.

[21] Appl. No.: 270,847

[22] Filed: Nov. 14, 1988

[51] Int. Cl.⁵ ........................................... H02H 7/122
[52] U.S. Cl. ..................................... 363/56; 323/289; 307/270; 307/280
[58] Field of Search ................... 363/17, 56, 131, 132, 363/80, 98; 323/282, 287, 289; 307/270, 280, 300

[56] References Cited

U.S. PATENT DOCUMENTS

| 4,270,164 | 5/1981 | Wyman et al. | 363/56 |
| 4,342,956 | 8/1982 | Archer | 323/289 |
| 4,356,416 | 10/1982 | Weischedel | 307/570 |
| 4,453,089 | 6/1984 | Shuey et al. | 307/253 |
| 4,639,823 | 1/1987 | Kuroki | 361/159 |
| 4,651,267 | 3/1987 | Nguyen et al. | 363/56 |
| 4,692,851 | 9/1987 | Attwood | 363/16 |
| 4,716,513 | 12/1987 | Ito | 363/56 X |
| 4,728,817 | 3/1988 | Jessee et al. | 307/270 |
| 4,775,803 | 10/1988 | Mori | 323/289 X |

FOREIGN PATENT DOCUMENTS 0179828  4/1966  U.S.S.R. .................. 363/56

Primary Examiner—Steven L. Stephan
Assistant Examiner—Kristine Peckman
Attorney, Agent, or Firm—Antonelli, Terry, Stout & Kraus

[57]  ABSTRACT

An inverter in accordance with the present invention includes a plurality of bipolar transistors (102) with each bipolar transistor having a freewheeling diode (108) poled in parallel with outputs of the bipolar transistor, a current transformer (112) in a positive feedback circuit (110) associated with each bipolar transistor causing a positive feedback to be applied from an output of the inverter to a base of each bipolar transistor to provide a base drive proportional to current flowing in a load coupled to the bipolar transistors, a rectifier (120), disposed in each of the positive feedback circuits for permitting current to flow to the base of the bipolar transistor when the bipolar transistor is conductive and blocking flow of current from the base to the emitter when the bipolar transistor is not forward biased.

23 Claims, 5 Drawing Sheets

INVERTER WITH PROPORTIONAL BASE DRIVE CONTROLLED BY A CURRENT TRANSFORMER

TECHNICAL FIELD

The present invention relates to proportional base drives for controlling conductivity of bipolar transistors. More specifically, the invention relates to proportional base drives for controlling the conductivity of bipolar transistors contained in inverters.

BACKGROUND ART

U.S. Pat. No. 4,651,267, which is assigned to the Assignee of the present invention, discloses a proportional base drive circuit for a transistorized bridge inverter. The proportional base drive circuit disclosed in the '267 patent has a positive feedback circuit which applies current, proportional to load current being switched by the bipolar transistors, to the bases of the bipolar transistors.

One form of the proportional base drive of the '267 patent is illustrated in FIG. 1. The proportional base is achieved by a current transformer 20 which has a primary winding 20a coupled to the output of a common point of the bipolar transistor switches T1 and T2 for developing a voltage in the secondary windings 20b and 20c, respectively, across resistors R1 and R2 which is proportional to the load current. The current in the secondary windings 20b and 20c is respectively full-wave rectified by full-wave rectifiers 24 and 26 which are respectively comprised of diodes D3-D6 and D7-D10. The potentials which are switched by the bipolar transistor switches T1 and T2 are respectively from voltage sources E1 and E2 which are connected together at neutral N. Base drive logic 22 controls the conductivity of feedback switches S1 and S2 which when conductive permit positive feedback from the secondary windings 20b and 20c to be respectively applied to bipolar transistor switches T1 and T2 to control the degree of saturation as a function of load current.

The proportional base drive provided in the inverter of the '267 patent is advantageous for the reason that the operating frequency of the power bipolar transistors in the inverter may be increased by controlling the degree of saturation of the transistors as a function of the load current. The proportional base drive provided to each of the bases of the bipolar transistor switches T1 and T2 in the inverter is chosen to have a magnitude which permits the rapid turnoff of the bipolar transistors. The proportional base drive circuit insures that the base drive applied to the bipolar transistors is not so large as to drive the transistors so far into saturation for light loads that extra time is required to turn the bipolar transistors off under light load conditions as a consequence of excessive minority carriers being present in the base region.

While the proportional base drive circuit disclosed in the '267 patent provides a controllable base drive for achieving rapid turnoff, it has a disadvantage that current flowing in the freewheeling diodes D1 and D2, which are poled in antiparallel across the outputs of the bipolar transistor switches, causes a rectified current to be produced by the full-wave rectifiers 24 and 26 which applies positive base drive to the bipolar transistor switches T1 and T2 in a reverse conduction mode when the transistors in fact should be totally turned off. The reverse conduction mode is caused by the freewheeling diodes D1 and D2 being forward biased by a lagging current (lagging power factor). In the reverse conduction mode the emitter functions as a collector and the collector functions as an emitter with positive feedback from the freewheeling diodes D1 and D2 causing the transistor to be driven harder into the reverse conduction mode. The aforementioned full-wave rectification results in the bipolar transistor switches T1 and T2 being driven at least partially into the reverse conduction mode which represents an undesired mode of conduction which represents a power loss during current flow in the freewheeling diodes D1 and D2.

DISCLOSURE OF THE INVENTION

The present invention provides an inverter which is an improvement of the inverter disclosed in U.S. Pat. No. 4,651,267. The proportional base drive circuit of the present invention utilizes a current transformer in the output from a bipolar transistor to generate a positive feedback voltage which is applied to a positive feedback circuit coupling the emitter of the bipolar transistor to the base of the transistor in which current can only flow from the emitter to the base of the bipolar transistor during a normal conduction mode of the bipolar transistor. Accordingly, unlike the proportional base drive circuit disclosed in the aforementioned '267 patent, in which current flowing in a freewheeling diode D1 or D2 in parallel with a bipolar transistor switch T1 or T2 provides positive base drive to the transverse in a reverse conduction mode, the present invention utilizes a half wave rectifier disposed in the positive feedback circuit to prevent positive base drive being applied from currents flowing in a freewheeling diode in parallel with outputs of a bipolar transistor. The proportional base drive circuit of the present invention is more efficient than that of the '267 patent in that base drive is totally removed from the bipolar transistor during intervals in which current is flowing in a freewheeling diode. Accordingly, losses consequent from undesired reverse base drive being applied to the bipolar transistor in response to current flow in freewheeling diodes in parallel with bipolar transistor switches are eliminated.

A proportional base drive for at least one bipolar transistor having a controlled conductivity which is proportional to current flowing in an electrical load coupled to the bipolar transistor in accordance with the invention includes a current transformer having a primary winding coupled to an output of the bipolar transistor and at least one secondary winding; a positive feedback circuit coupled between an emitter of the bipolar transistor and a base of the bipolar transistor for applying positive feedback from the emitter to the base proportional to current flowing in a load; a feedback switch in the positive feedback for controlling the flow of current in the positive feedback circuit with the feedback having conductive and non-conductive states; a rectifier, disposed in the positive feedback circuit, for permitting current to flow to the base of the bipolar transistor from the emitter of the bipolar transistor when the bipolar transistor is conductive and blocking flow of current from the base to the emitter when the bipolar transistor is not forward biased; a first secondary winding of the current transformers being disposed in the feedback circuit for causing positive feedback to be applied to the base of the bipolar transistor s when the bipolar transistor is conductive; a base drive control circuit for producing at least one control signal coupled to the base of the bipolar transistor and to a control electrode of the feedback switch with the at least one control signal controlling the conductivity of the feedback switch and the bipolar transistor. A freewheeling diode is coupled in parallel with outputs of the transistor with the freewheeling diode being poled with respect to the emitter and a collector of the bipolar transistor so that current may flow through the freewheeling diode when the bipolar transistor is conductive; and the rectifier blocks current flow from the base of the bipolar transistor to the emitter when current is flowing in the freewheeling diode as caused by a lagging current. Furthermore, a control transistor is provided having a control electrode coupled to a control signal from the base drive control circuit, a non-inverting output coupled to the control electrode of the feedback switch and an inverting output coupled to the base of the bipolar transistor. The feedback switch preferably is a MOSFET and the control transistor is preferably a bipolar transistor.

A current protection circuit is provided for detecting when current flowing in the output of the bipolar transistor exceeds a predetermined magnitude and generates a shutoff signal when the current exceeds the magnitude of current which is coupled to the base drive control circuit for causing the transistor to be shutoff. The current protection circuit includes a full-wave rectifier coupled to the second secondary winding; a comparator having a first input coupled to an output of the full-wave rectifier and a second input coupled to a current reference, the comparator producing a disabling output signal when the current from the full-wave rectifier exceeds the magnitude of the current reference to cause the generation of the shutoff signal. The current protection circuit further includes a resistance coupled between outputs of the full-wave rectifier, the first input to the comparator being from the resistance; a gate having a pair of inputs for producing the shutoff signal when the disabling output is present, one of the inputs being the output from the comparator and the second of the inputs being a pulse width control signal.

The proportional base drive circuit of the present invention may be utilized to control the conductivity of bipolar transistors connected in a Darlington configuration. A freewheeling diode is coupled in parallel with outputs of each of the bipolar transistors with each freewheeling diode being poled with recess to the emitter and a collector of the parallel connected bipolar transistors so that current may flow through the freewhelling diode when the associated bipolar transistors are conductive; and the rectifier blocks current flow from the base of the bipolar transistor switches to the emitter when current is flowing in the freewheeling diodes.

The individual bipolar transistor of the proportional base drive may be disposed in an inverter with pairs of the bipolar transistors being coupled between reference potentials and to the base control circuit. The base control circuit switches the bipolar transistor alternately to provide an alternating current output. Each bipolar transistor contains a separate positive feedback circuit, feedback switch, and rectifier and a separate secondary winding of the current transformer is respectively disposed in the feedback circuits of each bipolar transistor for providing a positive feedback voltage to the base of the bipolar transistor coupled to the positive feedback circuit when the bipolar transistor coupled to the positive feedback circuit is conductive. A current protection circuit is provided having a second secondary winding of the current transformer for detecting when current flowing in the output of one of the bipolar transistors exceeds a predetermined magnitude and generates a shutoff signal when the current exceeds the magnitude which is coupled to the base drive control circuit for causing the transistor to be shutoff. The current protection circuit comprises a full-wave rectifier coupled to the second secondary winding; a comparator having a first input coupled to an output of the full-wave rectifier and a second input coupled to a current reference, the comparator producing a disabling signal when the current from the full-wave rectifier exceeds the magnitude of the current reference to cause the generation of the shutoff signal. The current protection circuit further includes a resistance coupled between outputs of the full-wave rectifier, the first input to the comparator being from the resistance; a gate having a pair of inputs for producing the shutoff signal when the disabling output is present, one of the inputs being the output of the comparator and the second of the inputs being a pulse width control signal.

The inverter may be a neutral clamped inverter. The neutral clamped inverter includes an additional secondary winding of the current transformer; a full-wave rectifier coupled in parallel with the additional secondary winding; a neutral bipolar transistor coupled between a common output of the bipolar transistors and a neutral, an additional positive feedback circuit coupled between an emitter of the neutral bipolar transistor and the base of the neutral bipolar transistor, an additional feedback switch having an output coupled to a base of the neutral bipolar transistor and for controlling the flow of current in the additional positive feedback circuit with the additional feedback switch having conductive and non-conductive states controlled by a control signal from the base drive control circuit and an output of the full-wave rectifier being coupled to the additional feedback switch so that rectified current form the additional winding controls conductivity of the neutral bipolar transistors when the additional feedback switch is conductive.

In an inverter having a plurality of bipolar transistors with each bipolar transistors having an freewheeling diode poled in parallel with outputs of the bipolar transistor, a current transformer in a positive feedback circuit associated with each bipolar transistors causing a positive feedback to be applied from an output of the inverter to a base of each bipolar transistor to provide a bases drive proportional to current flowing in a load coupled to the bipolar transistors, an improvement in accordance with the present invention includes a rectifier, disposed in each of the positive feedback circuits, for permitting current to flow to the base of the bipolar transistor from an emitter of the bipolar transistor switch and flow of current from the base to the emitter when the bipolar transistor is conductive. Each of the rectifiers is a diode in series with a feedback switch, disposed in the positive feedback circuit, for controlling the flow of current in the positive feedback circuit with the feedback switch having conductive and non-conductive states controlled by a base drive control circuit. Each of the feedback switches is preferably a MOSFET.

BEST MODE FOR CARRYING OUT THE INVENTION

Figure 2:
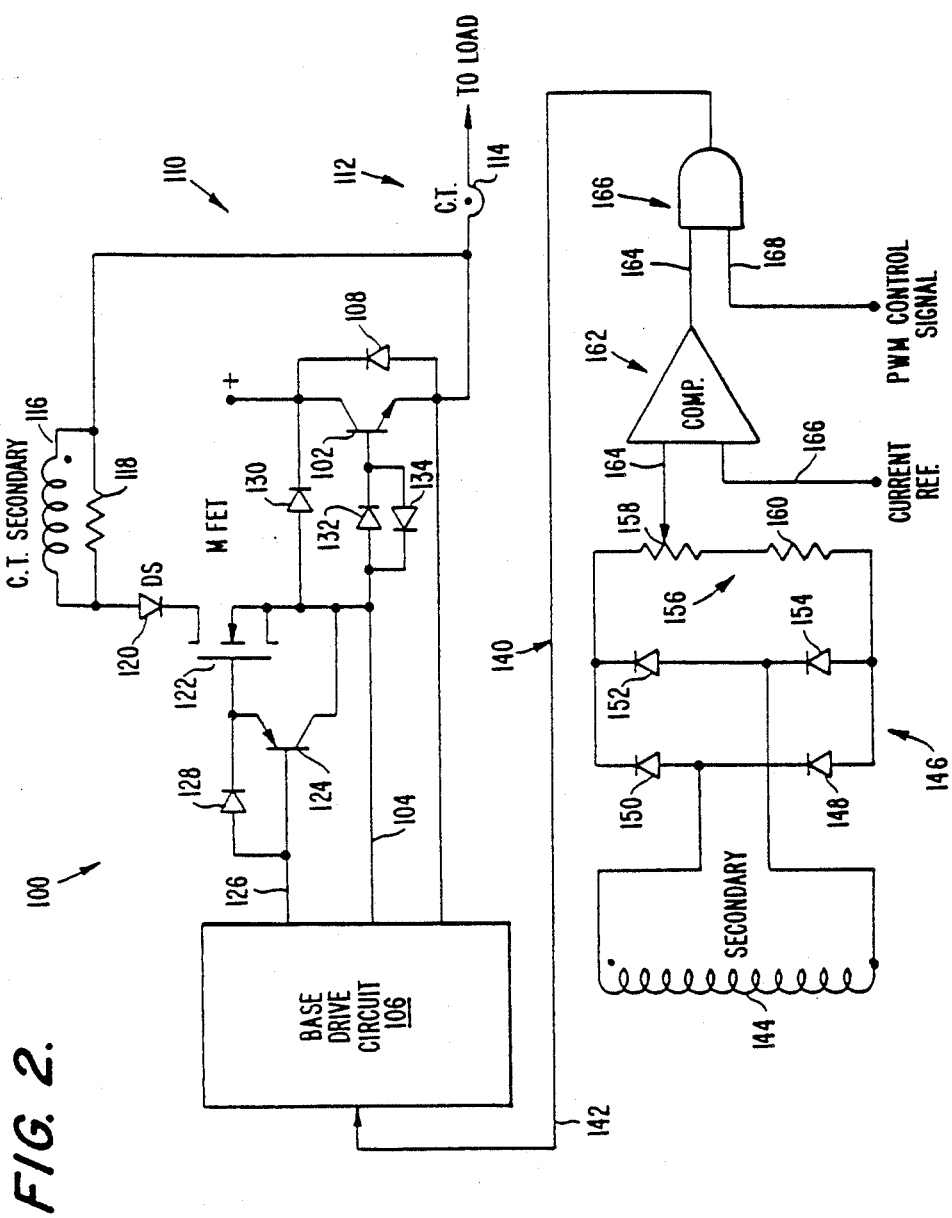
FIG. 2 illustrates a first embodiment of the present invention.

FIG. 2 illustrates a first embodiment of a proportional drive circuit 100 in accordance with the present invention. The proportional drive circuit 100 functions in a manner generally like the base drive circuits disclosed in U.S. Pat. No. 4,651,267 with the exception of the proportional base drive being disabled when current is flowing through the freewheeling diode 108 as described below. The proportional drive circuit 100 has a bipolar transistor 102 which is switched on and off by a control signal applied from line 104 that is outputted by a base drive circuit 106 which may be of the type disclosed in the aforementioned U.S. Pat. No. 4,651,267 and functions in a manner as described therein. A conventional, freewheeling diode 108 is poled across outputs of the bipolar transistor 102 to conduct current around the conductive bipolar transistor such as that occurring with lagging currents. Proportional base drive is provided by a positive feedback circuit 110 which couples the emitter of bipolar transistor 102 to the base of the bipolar transistor. The primary 114 of the current transformer 112 is coupled to the emitter of the bipolar transistor 102 to sense the current flowing to a load (not illustrated). The primary 114 of the current transformer 112 is magnetically linked to secondary 116. The secondary 116 is in parallel with resistance 118. A voltage is developed in the secondary 116 across resistance 118 as a consequence of current flow through resistor 118 which is proportional to the current flowing in the primary 114. Diode 120 permits positive feedback to flow from the emitters of bipolar transistor 102 to the base of the bipolar transistor through feedback MOSFET switch 122. Bipolar control transistor 124 drives the control electrode of feedback transistor 122. A suitable control signal is applied to the base of bipolar control transistor 124 on line 126. Diode 128 provides biasing for the base to emitter junction of the bipolar control transistor 124. Diode 130 provides protection for the base to collector junction of the bipolar transistor 102. The parallel configuration of diodes 132 and 134 provides suitable biasing of the base to emitter junction of the bipolar transistor switch 102. The resistance 118 is chosen so that the voltage developed across the secondary 116 is sufficient to overcome diode drop of diode 120, the drop across MOSFET 122 the diode drops across diodes 132 and 134. The voltage is a function of the turns ratio between the primary 114 and the secondary 116.

Preferably, the MOSFET 122 is a power MOSFET which has a response which is faster than the response of the bipolar transistor switch 102 and is preferably an order of magnitude faster than the response of the bipolar transistor. This provides a rapid turn on for the power MOSFET 122 which is driven by bipolar transistor 124 which in turn produces an amplified output signal which is applied to the base of the bipolar transistor switch 102 to cause the collector current in the bipolar transistor to rise exponentially to a saturated level which is proportional to the current flowing in the primary 114 of the current transformer 112.

Figure 1:
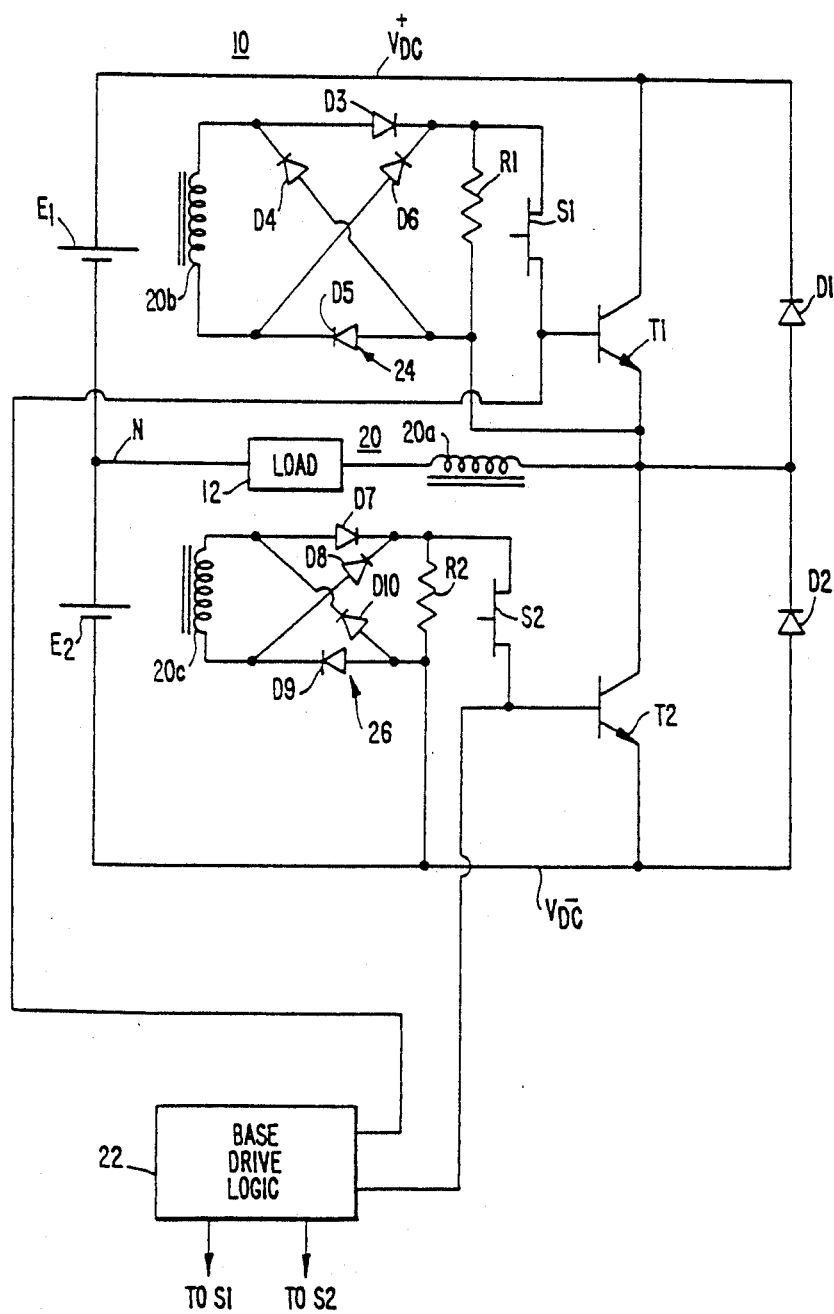
FIG. 1 illustrates a prior art proportional base drive circuit in an inverter.

Importantly, the diode 120 blocks the flow of current from the base to the emitter of the bipolar transistor 102 caused by lagging current flowing through the freewheeling diode 108 which in the prior art of FIG. 1 caused positive base drive to be applied to the bipolar transistor 102 operating in a reverse conduction mode. Accordingly, the first embodiment 100 prevents a reverse conduction mode caused by reverse base drive being applied to the bipolar transistor switch 102 when current is flowing in the freewheeling diode 108 which in the prior art resulted in lower efficiency and undesired losses in the bipolar transistors utilized for controlling high power loads.

The current transformer 112 also controls an overcurrent protection circuit 140 which functions to provide a shutoff signal which is applied on line 142 to the base drive circuit to cause the base drive circuit 106 to shutdown the switching of the bipolar transistor 102 in response to the detection of a load (not illustrated) drawing a current which exceeds a predetermined magnitude which would damage the switches if operation were to continue. The overcurrent protection circuit 140 has a secondary winding 144 which is magnetically coupled to the primary winding 114 of the current transformer 112. Full-wave rectifier 146, which is comprised of diodes 148–152, rectifies the current outputted by the secondary winding 144. A series circuit 156, which is comprised of potentiometer 158 and resistance 160, is connected in parallel to the outputs of the full-wave rectifier 146. Comparator 162 produces an output signal of a first level in response to an input signal on a first input 164 from the potentiometer 158 being greater in magnitude than an input signal on a second input 166 which is a reference current value used for determining when an overcurrent condition is present. A disabling output signal is present on the output 164 of the comparator 162 when an overcurrent condition is sensed by the comparator 162. The disabling output signal has a low level which disables the output signal from AND gate 166 which is the shutoff signal controlling the shut off of switching of the bipolar transistor switch 102. When the bipolar transistor 102 is operating normally, a pulse width modulation control signal applied on input 168 is outputted on line 142 as a consequence of the output of the comparator 162 being high each time a pulse width modulation control signal is present when an overcurrent condition is not present. Alternatively, the output of the comparator 162 may be high when an overcurrent condition is present with an inverter being present on the input 164 to enable the pulse width modulation control signal to be passed during normal operation when an overcurrent condition does not exist.

Figure 3:
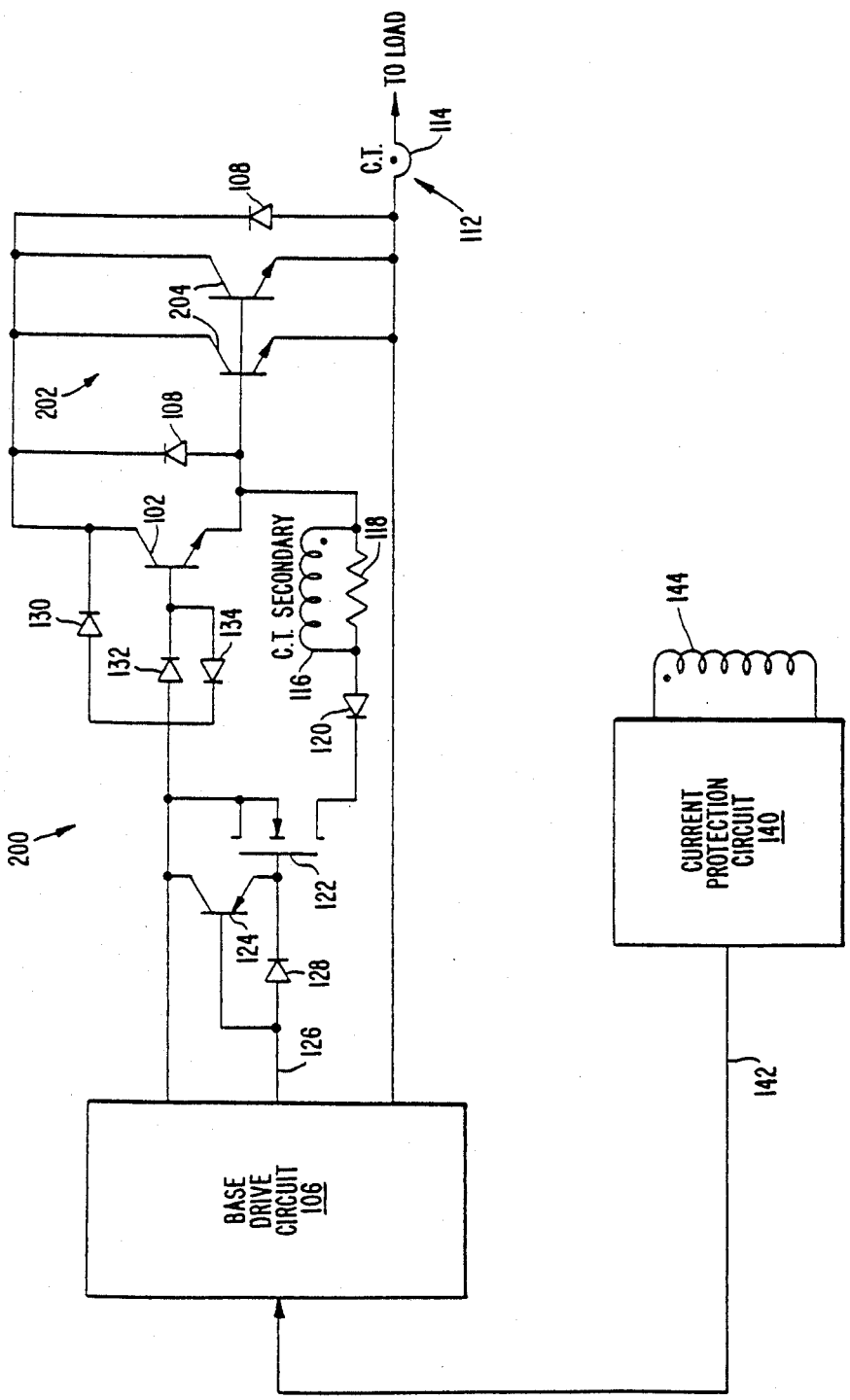
FIG. 3 illustrates a second embodiment of the present invention.

FIG. 3 illustrates a second embodiment 200 of the present invention. Like reference numerals identify like parts in FIGS. 2 and 3. The only difference between the embodiments of FIGS. 2 and 3 is that a Darlington configuration 202 comprised of a driver bipolar transistor 102 and at least one parallel connected driven bipolar transistor 204 is controlled by the proportional base drive of the embodiment.

Figure 4:
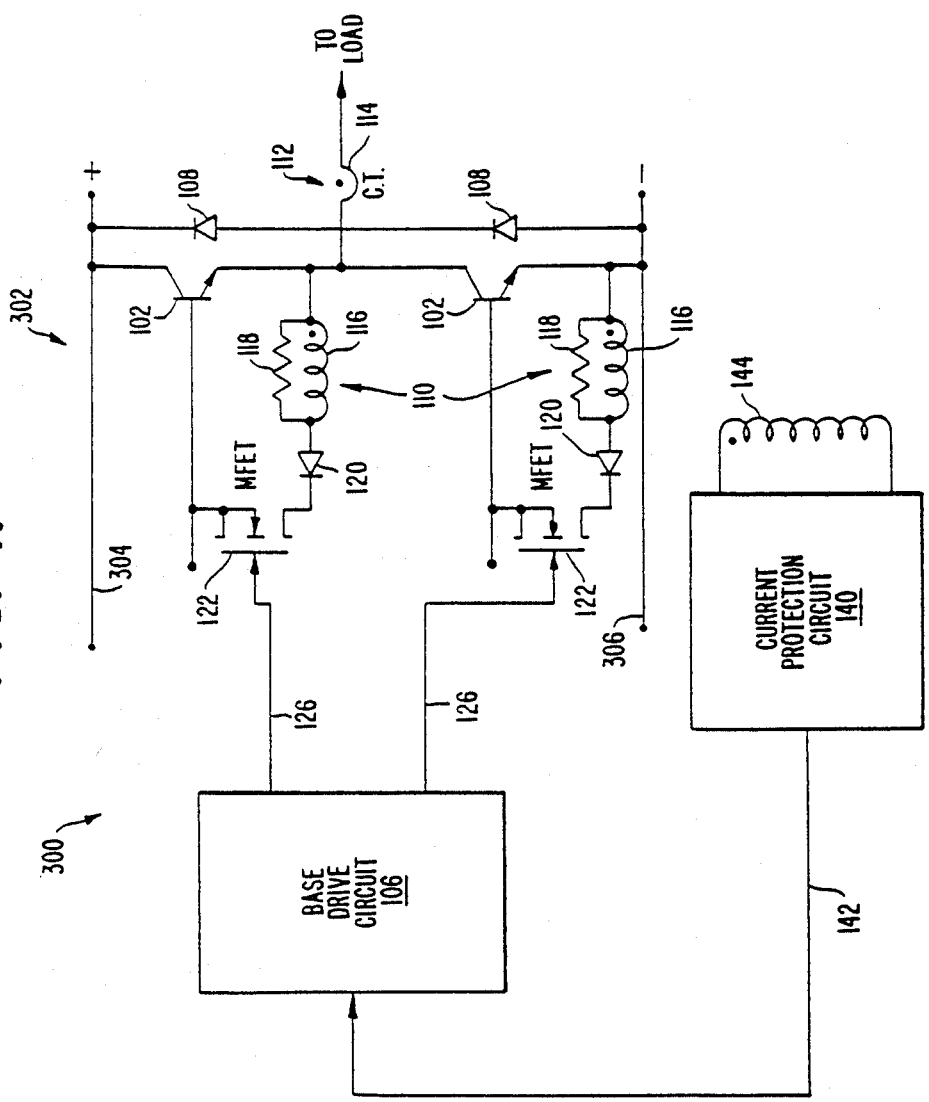
FIG. 4 illustrates a third embodiment of the present invention.

A third embodiment 300 is illustrated in FIG. 4. Like reference numerals identify like parts in FIGS. 2–4. The only substantial difference from the embodiments of FIGS. 2 and 3 and FIG. 4 is that in FIG. 4 a pair of bipolar transistor 102 are provided in an inverter 302 which is of conventional design. The inverter has a positive rail 304 and a negative rail 306 which are alternately switched to the output to cause current to flow through the primary winding 114 of the current transformer 112 in response to appropriately timed signals from the base drive circuit 106 in accordance with conventional inverter operation. It should further be understood that while the embodiment illustrated in FIG. 4 has only a single phase, the present invention may be used in multiple phase inverters with equal facility. The base drive circuit 106 alternately applies control signals to outputs 126 to switch the rails 304 and 306 to the output to produce a pulsating alternating current output. Furthermore, a pulse width modulation control signal may be applied to the base drive circuit 106 on output 142 of the current protection circuit 140 as described above to pulse width modulate the output voltage to produce a sinusoidal output.

Figure 5:
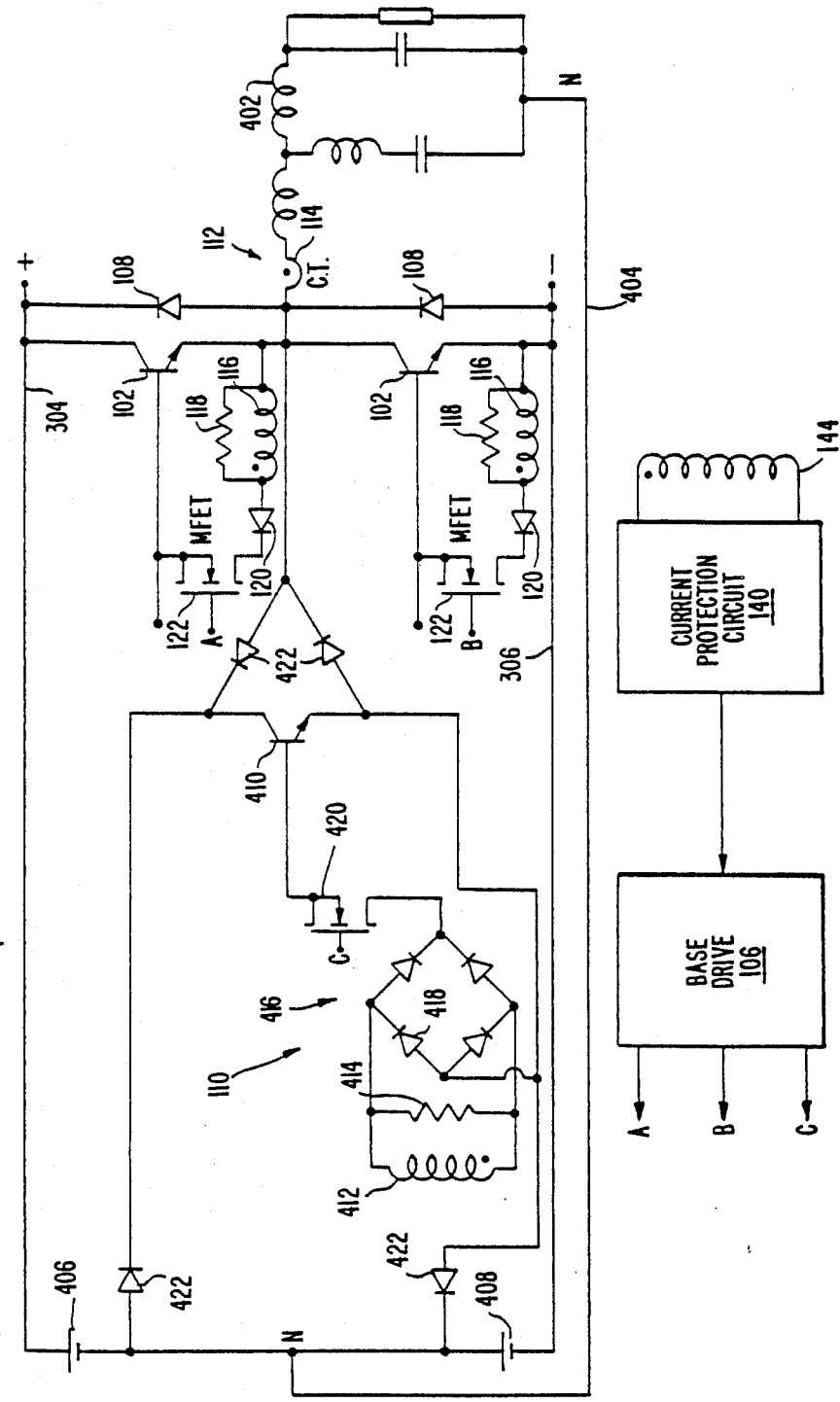
FIG. 5 illustrates a fourth embodiment of the present invention.

FIG. 5 illustrates a fourth embodiment 400 of the present invention which is a neutral clamped inverter incorporating a pair of proportional base drive circuits in accordance with the embodiment of FIG. 4. Like parts are identified by like reference numerals in FIGS. 2-5. The output of the pair of bipolar transistor switches 102 is coupled to a load 402 which contains a neutral N. Neutral current flows on line 404 back to the junction point of power sources 406 and 408 which respectively provide potential to the positive rail 304 and the negative rail 306. Bidirectional switch 410 performs the same function as the bidirectional switch illustrated in FIG. 3 of U.S. Pat. No. 4,651,267. An additional secondary winding 412 develops a potential across resistance 414 which is coupled in parallel thereto. A full-wave rectifier 416 is coupled in parallel to the secondary winding 412 and resistance 414. The full-wave rectifier 416 is comprised of individual diodes 418. A MOSFET feedback switch 420 controls the application of positive feedback by means of positive feedback circuit 110 to neutral bipolar switch 410. The bidirectional switch 410 functions in a manner described in greater detail in U.S. patent application Ser. No. 672,305, filed Nov. 16, 1984, entitled "Control For a Neutral Point Clamp PWM Inverter" and in conjunction with FIG. 3 of the aforementioned U.S. Pat. No. 4,651,267. Diodes 422 are part of the neutral bipolar switch.

While the invention has been described in terms of its preferred embodiments, it should be understood that numerous modifications may be made thereto without departing from the spirit and scope of the invention as defined in the appended claims. It is intended that all such modifications fall within the scope of the appended claims.

We claim:

1. A proportional base drive for at least one bipolar transistor having a controlled conductivity which is proportional to current flowing in an electrical load coupled to a first bipolar transistor comprising:
   a current transformer having a primary winding coupled to an output of the first bipolar transistor and at least one secondary winding;
   a positive feedback circuit coupled between an emitter of the bipolar transistor and a base of the bipolar transistor for applying positive feedback from the emitter to the base proportional to current flowing in a load;
   a feedback switch disposed in the positive feedback circuit for controlling the flow of current in the positive feedback circuit with the feedback switch having conductive and non-conductive states;
   a rectification means, disposed in the positive feedback circuit, for permitting current to flow to the base of the bipolar transistor from the emitter of the bipolar transistor when the bipolar transistor is conductive and blocking flow of current from the base to the emitter when the bipolar transistor is not forward biased;
   a first secondary winding of the current transformer being disposed in the positive feedback circuit for causing positive feedback to be applied to the base of the bipolar transistor when the bipolar transistor is conductive; and
   a base drive control circuit for producing at least one control signal coupled to the base of the bipolar transistor and to a control electrode of the feedback switch with the at least one control signal controlling the conductivity of the feedback switch and the bipolar transistor.

2. A proportional base drive in accordance with claim 1 further comprising:
   a free wheeling diode coupled to and poled with respect to the emitter and a collector of the bipolar transistor so that current may flow through the free wheeling diode when the bipolar transistor is not conductive; and
   the rectification means locking current flow from the base of the bipolar transistor to the emitter when current is flowing in the free wheeling diode.

3. A proportional base drive in accordance with claim 2 further comprising:
   a control transistor having a control electrode coupled to a control signal from the base drive control circuit, a first electrode providing a signal which is an amplification of the control signal coupled to the control electrode of the feedback switch and a second electrode providing a signal which is an inversion of the control signal coupled to the base of the bipolar transistor.

4. A proportional base drive in accordance with claim 3 wherein:
   the feedback switch is a MOSFET; and
   the control transistor is a bipolar transistor.

5. A proportional base drive in accordance with claim 3 further comprising:
   a second bipolar transistor, the second transistor being coupled in a Darlington configuration with the first bipolar transistor;
   a free wheeling diode coupled to the Darlington configured bipolar transistors and being poled with respect to an emitter and a collector of the Darlington configured bipolar transistors so that current may flow through the free wheeling diode when the Darlington configured bipolar transistors are non-conductive; and
   the rectification means blocking current flow from a bases of the bipolar transistors to the emitters when current is flowing in the free wheeling diodes.

6. A proportional base device in accordance with claim 2 wherein:
   the electrical load is also coupled to an additional bipolar transistor, an emitter electrode and a collector electrode of each bipolar transistor being respectively coupled to a different reference potential in an inverter and bases of the bipolar transistors being coupled to the base drive control circuit;
   the base drive control circuit switches the bipolar transistors alternately to provide an alternating current output; and the additional transistor is connected to a positive feedback circuit, feedback switch, rectification means and a first additional secondary winding of the current transformer is disposed in the feedback circuit connected to the additional bipolar transistor for providing a positive feedback to the base of the additional bipolar transistor when the additional bipolar transistor coupled to the positive feedback circuit is conductive.

7. A proportional base drive in accordance with claim 6 further comprising:
a current protection circuit having a second secondary winding of the current transformer coupled to each bipolar transistor for detecting when current flowing through the load exceeds a predetermined magnitude and generating a shutoff signal, when the current flowing through the load exceeds the predetermined magnitude of current, which is coupled to the base drive control circuit for causing the transistors to be shutoff.

8. A proportional base drive in accordance with claim 7 wherein the current protection circuit comprises:
a full-wave rectifier coupled to the second secondary winding; and
a comparator having a first input coupled to rectified current produced by the full-wave rectifier and a second input coupled to a current reference, the comparator producing a disabling output signal when the current from the full-wave rectifier exceeds a magnitude of the current reference to cause the generation of the shutoff signal.

9. A proportional base drive in accordance with claim 8 further comprising:
a resistance, coupled between outputs of the full-wave rectifier, the first input to the comparator being from the resistance; and
a gate having a pair of inputs for producing the shutoff signal when the disabling output signal is present, one of the inputs being the output of the comparator and the second of the inputs being a pulse width control signal for controlling current outputted by the bipolar transistor switch.

10. A proportional base drive in accordance with claim 6 wherein:
the inverter is a neutral clamped inverter.

11. A proportional base drive in accordance with claim 10 further comprising:
a second additional secondary winding of the current transformer;
a full-wave rectifier coupled in parallel with the second additional secondary winding;
a neutral bipolar transistor coupled between a common output of the bipolar transistors and a neutral, an additional positive feedback circuit coupled between an emitter of the neutral bipolar transistor and a base of the neutral bipolar transistor, an additional feedback switch having an output coupled to a base of the neutral bipolar transistor and for controlling the flow of current in the additional positive feedback circuit with the additional feedback switch having conductive and non-conductive states controlled by a control signal from the base drive control circuit and rectified current from the full-wave rectifier being coupled to the additional feedback switch so that rectified current from the additional secondary winding controls conductivity of the neutral bipolar transistor when the additional feedback switch is conductive.

12. A proportional base drive in accordance with claim 1 further comprising:
a current protection circuit having a second secondary winding of the current transformer coupled to an output of the bipolar transistor for detecting when current flowing through the load exceeds a predetermined magnitude and generating a shutoff signal, when the current flowing in the load exceeds the predetermined magnitude of current, which is coupled to the base drive control circuit for causing the transistor to be shutoff.

13. A proportional base drive in accordance with claim 12 further comprising:
a free wheeling diode coupled to and poled with respect to the emitter and a collector of the bipolar transistor so that current may flow through the free wheeling diode when the bipolar transistor is not conductive; and
the rectification means blocking current flow from the base of the bipolar transistor to the emitter when current is flowing in the free wheeling diode.

14. A proportional base drive in accordance with claim 12 wherein the current protection circuit comprises:
a full-wave rectifier coupled to the second secondary winding; and
a comparator having a first input coupled to rectified current produced by the full-wave rectifier and a second input coupled to a current reference, the comparator producing a disabling output signal when the current from the full-wave rectifier exceeds the magnitude of the current reference to cause the generation of the shutoff signal.

15. A proportional base drive in accordance with claim 14 wherein the current protection circuit further comprises:
a resistance coupled between outputs of the full-wave rectifier, the first input to the comparator being from the resistance; and
a gate having a pair of inputs for producing the shutoff signal when the disabling output signal is present, one of the inputs being the output of the comparator and the second of the inputs being a pulse width control signal for controlling current outputted by the bipolar transistor.

16. A proportional base drive in accordance with claim 15 further comprising:
a second bipolar transistor, the second transistor being coupled in a Darlington configuration with the first bipolar transistor;
a free wheeling diode coupled to the Darlington configured bipolar transistors and being poled with respect to an emitter and a collector of the Darlington configured bipolar transistors so that current may flow through the free wheeling diode when the Darlington configured bipolar transistors are non-conductive; and
the rectification means blocking current flow from bases of the bipolar transistors to the emitters when current is flowing in the free wheeling diodes.

17. A proportional base drive in accordance with claim 14 further comprising:
a second bipolar transistor, the second transistor being coupled in a Darlington configuration with the first bipolar transistor;

a free wheeling diode coupled to the Darlington configured bipolar transistors and being poled with respect to an emitter and a collector of the Darlington configured bipolar transistors so that current may flow through the free wheeling diode when the Darlington configured bipolar transistors are non-conductive; and the rectification means blocking current flow from bases of the bipolar transistors to the emitters when current is flowing in the free wheeling diodes.

18. A proportional base drive in accordance with claim 12, further comprising:

a second bipolar transistor, the second transistor being coupled in a Darlington configuration with the first bipolar transistor;

a free wheeling diode coupled to the Darlington configured bipolar transistors and being poled with respect to an emitter and a collector of the Darlington configured bipolar transistors so that current may flow through the free wheeling diode when the Darlington configured bipolar transistors are non-conductive; and the rectification means blocking current flow from a bases of the bipolar transistors to the emitters when current is flowing in the free wheeling diodes.

19. A proportional base drive in accordance with claim 1 further comprising:

a second bipolar transistor, the second transistor being coupled in a Darlington configuration with the first bipolar transistor;

a free wheeling diode coupled to the Darlington configured bipolar transistors and being poled with respect to an emitter and a collector of the Darlington configured bipolar transistors so that current may flow through the free wheeling diode when the Darlington configured bipolar transistors are non-conductive; and the rectification mans blocking current flow from bases of the bipolar transistors to the emitters when current is flowing in the free wheeling diodes.

20. In an inverter having a plurality of bipolar transistors with each bipolar transistors having a free wheeling diode with respect to an emitter and a collector of the bipolar transistor, a current transformer in a positive feedback circuit associated with each bipolar transistor causing a positive feedback to be applied from an output of the inverter to a base of each bipolar transistor to provide a base drive proportional to current flowing in a load coupled to the bipolar transistors, the improvement comprising:

a rectification means, disposed in each of the positive feedback circuits, for permitting current to flow to the base of the bipolar transistor from an emitter of the bipolar transistor when the bipolar transistor is conductive and blocking flow of current from the base to the emitter when the bipolar transistor is not forward biased.

21. An inverter in accordance with claim 20 wherein: each of the rectification means is a diode in series with a feedback switch disposed in the positive feedback circuit for controlling the flow of current in the positive feedback circuit with the feedback switch having a conductive and non-conductive states controlled by a base drive control circuit.

22. An inverter in accordance with claim 21 wherein: each of the feedback switches is a MOSFET.

23. An inverter in accordance with claim 20 wherein: the rectification means blocks current flow from the emitter to the base in each bipolar transistor when current is flowing in each freewheeling diode.

* * * * *